US009046780B2

(12) United States Patent
Yakunin

(10) Patent No.: US 9,046,780 B2
(45) Date of Patent: Jun. 2, 2015

(54) MULTILAYER MIRROR AND LITHOGRAPHIC APPARATUS

(75) Inventor: Andrei Mikhailovich Yakunin, Mierlo (NL)

(73) Assignee: ASML NETHERLANDS B.V., Veldhoven (NL)

( * ) Notice: Subject to any disclaimer, the term of this patent is extended or adjusted under 35 U.S.C. 154(b) by 474 days.

(21) Appl. No.: 13/438,337

(22) Filed: Apr. 3, 2012

(65) Prior Publication Data

US 2012/0320354 A1    Dec. 20, 2012

Related U.S. Application Data

(60) Provisional application No. 61/471,980, filed on Apr. 5, 2011.

(51) Int. Cl.
| | |
|---|---|
| *G02B 5/08* | (2006.01) |
| *G03F 1/24* | (2012.01) |
| *C03C 17/36* | (2006.01) |
| *G21K 1/06* | (2006.01) |
| *B82Y 10/00* | (2011.01) |
| *B82Y 40/00* | (2011.01) |

(52) U.S. Cl.
CPC .............. *G03F 1/24* (2013.01); *C03C 17/3642* (2013.01); *C03C 17/3663* (2013.01); *G21K 1/062* (2013.01); *G21K 2201/061* (2013.01); *G02B 5/0891* (2013.01); *B82Y 10/00* (2013.01); *B82Y 40/00* (2013.01)

(58) Field of Classification Search
None
See application file for complete search history.

(56) References Cited

U.S. PATENT DOCUMENTS

| 6,920,199 | B2 * | 7/2005 | Michaelsen ................... 378/84 |
| 7,336,416 | B2 * | 2/2008 | Van Herpen et al. ......... 359/359 |
| 8,144,830 | B2 * | 3/2012 | Yakshin et al. ................. 378/34 |
| 8,411,355 | B2 * | 4/2013 | Tsarfati et al. ............... 359/359 |
| 2004/0022354 | A1 * | 2/2004 | Shimizu ......................... 378/44 |
| 2011/0080573 | A1 * | 4/2011 | Glushkov et al. ............... 355/71 |
| 2014/0198306 | A1 * | 7/2014 | Yakunin et al. ................. 355/67 |

* cited by examiner

*Primary Examiner* — Derek S Chapel

(74) *Attorney, Agent, or Firm* — Pillsbury Winthrop Shaw Pittman LLP

(57) ABSTRACT

A multilayer mirror constructed to reflect radiation having a wavelength in the range of 6.4 nm to 7.2 nm. The multilayer mirror has alternating layers, including a first layer and a second layer. The first and second layers are selected from the group consisting of: U, or a compound or nitride thereof, and $B_4C$ layers; Th, or a compound or nitride thereof, and $B_4C$ layers; La, or a compound or nitride thereof, and $B_9C$ layers; La, or a compound or nitride thereof, and $B_4C$ layers; U, or a compound or nitride thereof, and $B_9C$ layers; Th, or a compound or nitride thereof, and $B_9C$ layers; La, or a compound or nitride thereof, and B layers; U, or a compound or nitride thereof, and B layers; C, or a compound or nitride thereof, and B layers; Th, or a compound or nitride thereof, and B layers.

14 Claims, 9 Drawing Sheets

MULTILAYER MIRROR AND LITHOGRAPHIC APPARATUS

CROSS-REFERENCE TO RELATED APPLICATIONS

This application claims the benefit of priority from U.S. Provisional Patent Application No. 61/471,980, filed Apr. 5, 2011, the content of which is incorporated herein by reference in its entirety.

FIELD

The present invention relates to a multilayer mirror and a lithographic apparatus that includes such a multilayer mirror.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A lithographic apparatus typically includes an illumination system configured to condition a radiation beam; a support structure constructed to hold a patterning device, such as a reticle or mask, the patterning device being capable of imparting the radiation beam with a pattern in its cross-section to form a patterned radiation beam; a substrate table constructed to hold a substrate; and a projection system configured to project the patterned radiation beam onto a target portion of the substrate.

A theoretical estimate of the limits of pattern printing can be given by the Rayleigh criterion for resolution as shown in equation (1):

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture $NA_{PS}$, or by decreasing the value of $k_1$.

In order to shorten the exposure wavelength and, thus, reduce the minimum printable size, it has been proposed to use an extreme ultraviolet (EUV) radiation source. EUV radiation sources are configured to output a radiation wavelength of about and/or below 13.5 nm. Thus, EUV radiation sources may constitute a significant step toward achieving small features printing. Such radiation is termed extreme ultraviolet or soft x-ray, and possible sources include, for example, laser-produced plasma sources, discharge plasma sources, or synchrotron radiation from electron storage rings.

Desirably, both the illumination system and the projection system include a plurality of optical elements in order to focus the radiation on the desired locations on the patterning device and the substrate, respectively. Unfortunately, apart from some gases at low density, no materials are known to be transmissive to EUV radiation. Therefore, the lithographic apparatus using EUV radiation does not employ transmissive lenses in its illumination system and in its projection system. Instead, the illumination system and the projection system desirably include mirrors. In addition, the patterning device is desirably a reflective device, e.g. a mirror having a reflective surface provided with a pattern formed by an absorptive material on the reflective surface, for the same reason.

To reflect EUV radiation having a wavelength of about 6.9 nm, multilayer mirrors have been proposed having alternating layers of a metal, such as (amongst other examples) La, U or Th, and B or a B compound, such as $B_4C$ or $B_9C$. Such a multilayer mirror reflects the EUV radiation according to Bragg's Law. For good optical performance of the multilayer mirror, it is desirable to have a sharp interface (i.e. transition) between the alternating layers. However, interlayer diffusion can arise, which may reduce this sharpness and thus adversely affect the optical performance (e.g. reflectivity) of the resultant multi-layer mirror.

Interlayer diffusion may arise due to a chemical interaction between materials forming the different, alternating layers. For example, at an interface between B on La, high chemical reactivity may be present between B and La, leading towards the formation of $LaB_6$, and a reduction in sharpness of the interface between the B and La layers. This process also occurs when B is substituted by $B_4C$. In another example, at an La on B (or $B_4C$) interface, high kinetic energy of relatively heavy La atoms arriving at the surface of relatively light B (or $B_4C$) layer atoms results in implantation of the B ($B_4C$) layer with La up to a depth of around 2 nm. Such implantation can result in a reduction in sharpness of the interface between the La and B layers.

SUMMARY

It is desirable to provide, for example, a multilayer mirror which obviates or mitigates at least one deficiency of the prior art, whether identified herein or elsewhere, or which provides an alternative to an existing multilayer mirror.

According to an aspect of the present invention, there is provided a multilayer mirror constructed and arranged to reflect radiation having a wavelength in the range of about 6.4 nm to about 7.2 nm, the multilayer mirror having alternating layers, the alternating layers comprising a first layer and a second layer, the first and second layers being selected from the group consisting of: U, or a compound or nitride thereof, and $B_4C$ layers; Th, or a compound or nitride thereof, and $B_4C$ layers; La, or a compound or nitride thereof, and $B_9C$ layers; La, or a compound or nitride thereof, and $B_4C$ layers; U, or a compound or nitride thereof, and $B_9C$ layers; Th, or a compound or nitride thereof, and $B_9C$ layers; La, or a compound or nitride thereof, and B layers; U, or a compound or nitride thereof, and B layers; C, or a compound or nitride thereof, and B layers; Th, or a compound or nitride thereof, and B layers; and wherein at least one of the first layers is separated from the second layer by an interlayer disposed between the at least one of the first layers and the second layer, the interlayer comprising Cs in substantially solid form.

Each first layer of a plurality of first layers may be separated from a second layer by an interlayer of Cs in solid form.

The solid Cs interlayer may comprise one or more monolayers of Cs, or the solid Cs interlayer may comprise Cs hydride.

The first and second layers may be selected from the group consisting of: La, or a compound or nitride thereof, and B layers; La, or a compound or nitride thereof, and $B_4C$ layers; La, or a compound or nitride thereof, and $B_9C$ layers.

The Cs interlayer may be formed from a Cs compound, such as Cs iodine, Cs fluoride, Cs oxide, Cs nitride, and the like.

A sum of a thickness of the first layer and a thickness of the second layer may be within the range of about 2.2 nm-about 3.5 nm.

The alternating (first and second) layers may have a period thickness which is between about 1.7 and about 2.5 times the thickness of the first layer or the second layer.

The multilayer mirror may form at least a part of a patterning device constructed and arranged to provide a beam of the radiation with a pattern in its cross-section. The patterning device may be a reticle or a mask. The reticle or mask may be provided with a structure having an absorptive material arranged to define a pattern, the absorptive material being Cr, Ta, Ti, Si, Ru, Mo, Al, or any combination thereof.

The multilayer mirror may have a substantially reflective surface provided with a capping layer comprising Ru, Rh, Ta, Ti, or any combination thereof.

The first layer may be a U compound layer which comprises one or more from the group consisting of $UF_3$, $UF_4$, $UF_5$, $UCl_3$, $UCl_4$, $UCl_5$, $UI_3$, $UI_4$, UO, $UO_2$, $UO_3$, $U_3O_8$, $U_2O_5$, $U_3O_7$, $U_4O_9$, $UTe_2$, $UTe_3$, UN, $U_2N_3$, and $U_3N_2$. Alternatively or additionally, the first layer may be a Th compound layer which comprises one or more from the group consisting of $ThF_3$, $ThF_4$, $ThCl_4$, $ThI_2$, $ThI_3$, $ThI_4$, $ThH_2$, $ThO_2$, $ThSe_2$, and ThN. In an embodiment, the first layer may be a La compound layer which comprises one or more from the group consisting of $LaH_2$, $LaH_3$, $LaF_3$, $LaCl_3$, $LaI_3$, $La_2O_3$, LaSe, and LaTe.

The mirror may form part of a projection system configured to project a patterned radiation beam onto a target portion of a substrate. Alternatively or additionally, the mirror may be form part of an illumination system configured to condition a radiation beam.

According to an aspect of the present invention, there is provided a lithographic projection apparatus arranged to project a pattern from a patterning device onto a substrate, wherein the lithographic apparatus comprises a multilayer mirror according to at least one embodiment described herein.

The lithographic apparatus may comprise: an illumination system configured to condition a radiation beam; a support structure constructed to hold a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate.

A multilayer mirror according to embodiments of the present invention may form a part of any one or more of the illumination system; the patterning device; the projection system, or an alignment system of, or used in conjunction with, the lithographic apparatus.

According to an aspect of the present invention, there is provided a method of forming a multilayer mirror that is to reflect (e.g. constructed and arranged to reflect) radiation having a wavelength in the range of about 6.4 nm to about 7.2 nm, the method comprising: providing alternating layers, the alternating layers comprising a first layer and a second layer, the first and second layers being selected from the group consisting of: U, or a compound or nitride thereof, and $B_4C$ layers; Th, or a compound or nitride thereof, and $B_4C$ layers; La, or a compound or nitride thereof, and $B_9C$ layers; La, or a compound or nitride thereof, and $B_4C$ layers; U, or a compound or nitride thereof, and $B_9C$ layers; Th, or a compound or nitride thereof, and $B_9C$ layers; La, or a compound or nitride thereof, and B layers; U, or a compound or nitride thereof, and B layers; C, or a compound or nitride thereof, and B layers; Th, or a compound or nitride thereof, and B layers; and separating at least one of the first layers from a second layer by an interlayer disposed between the at least one of the first layers and the second layer, the interlayer comprising Cs in substantially solid form.

Each first layer of a plurality of first layers may be separated from a second layer by an interlayer of Cs in solid form.

The solid Cs interlayer may comprise one or more monolayers of Cs, or the solid Cs interlayer may comprise Cs hydride.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
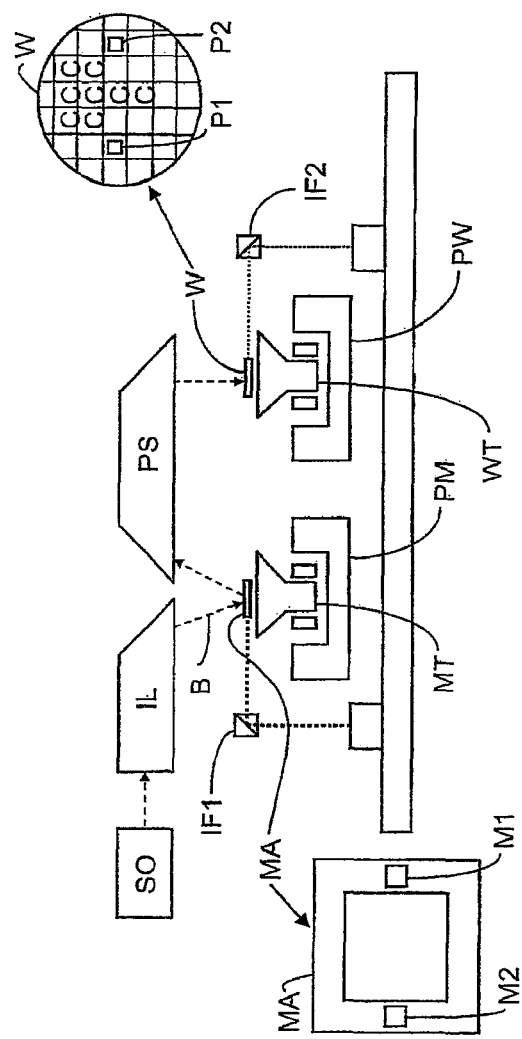
FIG. 1 schematically depicts a lithographic apparatus according to an embodiment of the present invention.

FIG. 1 schematically depicts a lithographic apparatus according to an embodiment of the invention. The apparatus includes: an illumination system (illuminator) IL configured to condition a radiation beam B (e.g. EUV radiation); a patterning device support or support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation. However, optical components which are configured to condition the radiation beam B are desirably reflective components due to the wavelength of radiation constituting the beam B.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as desired. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive, but is desirably reflective when used to pattern a beam of EUV radiation. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" may encompass any type of projection system, including refractive, reflective, catadioptric, magnetic, electromagnetic and electrostatic optical systems, or any combination thereof, as appropriate for the exposure radiation being used, or for other factors, especially the use of a vacuum. It may be desired to use a vacuum for EUV or electron beam radiation since other gases may absorb too much radiation or electrons. A vacuum environment may therefore be provided to the whole beam path with the aid of a vacuum wall and vacuum pumps.

As here depicted, the apparatus is of a reflective type (e.g. employing a reflective mask). Alternatively, the apparatus may be of a transmissive type (e.g. employing a transmissive mask), although this is likely to be impractical in an EUV lithographic apparatus.

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system including, for example, suitable directing mirrors and/or a beam expander. In other cases the source may be an integral part of the lithographic apparatus, for example when the source is a mercury lamp. The source SO and the illuminator IL, together with the beam delivery system if desired, may be referred to as a radiation system.

The illuminator IL may include an adjuster to adjust the angular intensity distribution of the radiation beam. Generally, at least the outer and/or inner radial extent (commonly referred to as δ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus could be used in at least one of the following modes:
1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.
2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.
3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as desired after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
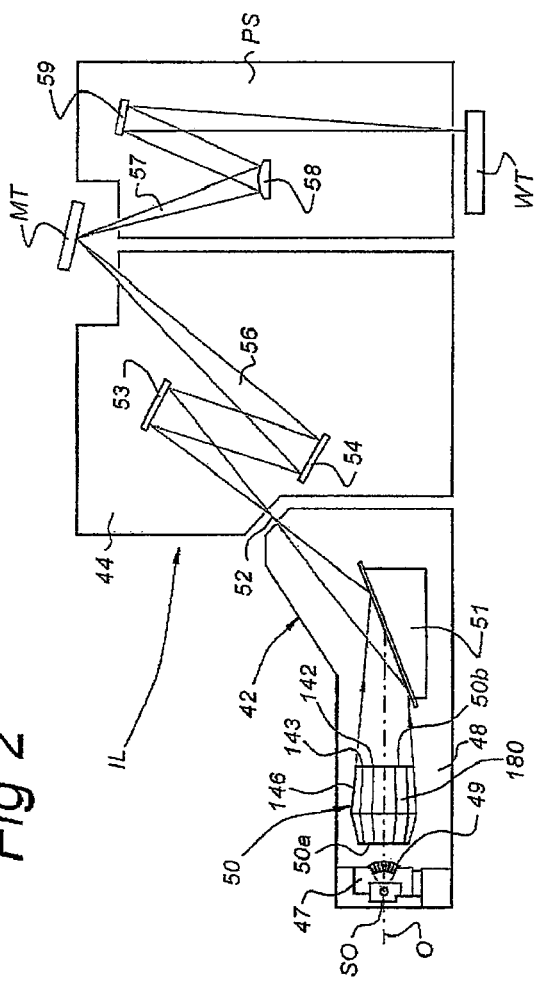
FIG. 2 schematically depicts a side view of an EUV illumination system and projection system of the lithographic projection apparatus of FIG. 1.

FIG. 2 shows the lithographic apparatus of FIG. 1 in more detail, including a radiation system 42, an illumination optics unit 44, and the projection system PS. The radiation system 42 includes the radiation source SO which may be formed by a discharge plasma (a DPP source). EUV radiation may be produced by a gas or vapor, for example Xe gas, Li vapor or Sn vapor in which a very hot plasma is created to emit radiation in the EUV range of the electromagnetic spectrum. The very hot plasma is created by causing an at least partially ionized plasma by, for example, an electrical discharge. Partial pressures of, for example, 10 Pa of Xe, Li, Sn vapor or any other suitable gas or vapor may be desired for efficient generation of the radiation. The radiation emitted by radiation source SO is passed from a source chamber 47 into a collector chamber 48 via a gas barrier or contaminant trap 49 which is positioned in or behind an opening in source chamber 47. The gas barrier 49 may include a channel structure.

The collector chamber 48 includes a radiation collector 50 which may be formed by a grazing incidence collector. Radiation collector 50 has an upstream radiation collector side 50a and a downstream radiation collector side 50b. Radiation passed by collector 50 can be reflected off a grating spectral filter 51 to be focused in a virtual source point 52 at an aperture in the collector chamber 48. From collector chamber 48, a beam of radiation 56 is reflected in illumination optics unit 44 via normal incidence reflectors 53, 54 onto a reticle or mask positioned on reticle or mask table MT. A patterned beam 57 is formed which is imaged in projection system PS via reflective elements 58, 59 onto wafer stage or substrate table WT. More elements than shown may generally be present in illumination optics unit 44 and projection system PS. Grating spectral filter 51 may optionally be present, depending upon the type of lithographic apparatus. Further, there may be more mirrors present than those shown in the Figures, for example there may be 1-4 more reflective elements present than 58, 59. Radiation collectors 50 are known from the prior art. The collector 50 may be a nested collector with reflectors 142, 143, and 146. A space 180 is provided between two reflectors, e.g. between reflectors 142 and 143.

In another embodiment (not shown), the source may be a laser produced plasma radiation source (an LPP source).

As discussed above, in order to reflect EUV radiation having a wavelength of about 6.4 nm to 7.2 nm, multilayer mirrors have been proposed having alternating layers of a material that is absorbent with respect to that radiation, and a material that is substantially optically transparent to that radiation. More particularly, to reflect EUV radiation having a wavelength of about 6.4 nm to 7.2 nm, multilayer mirrors have been proposed that are formed from alternating layers of a metal, such as (amongst other examples) La, U or Th, and B or a B compound, such as $B_4C$ or $B_9C$.

Figure 3:
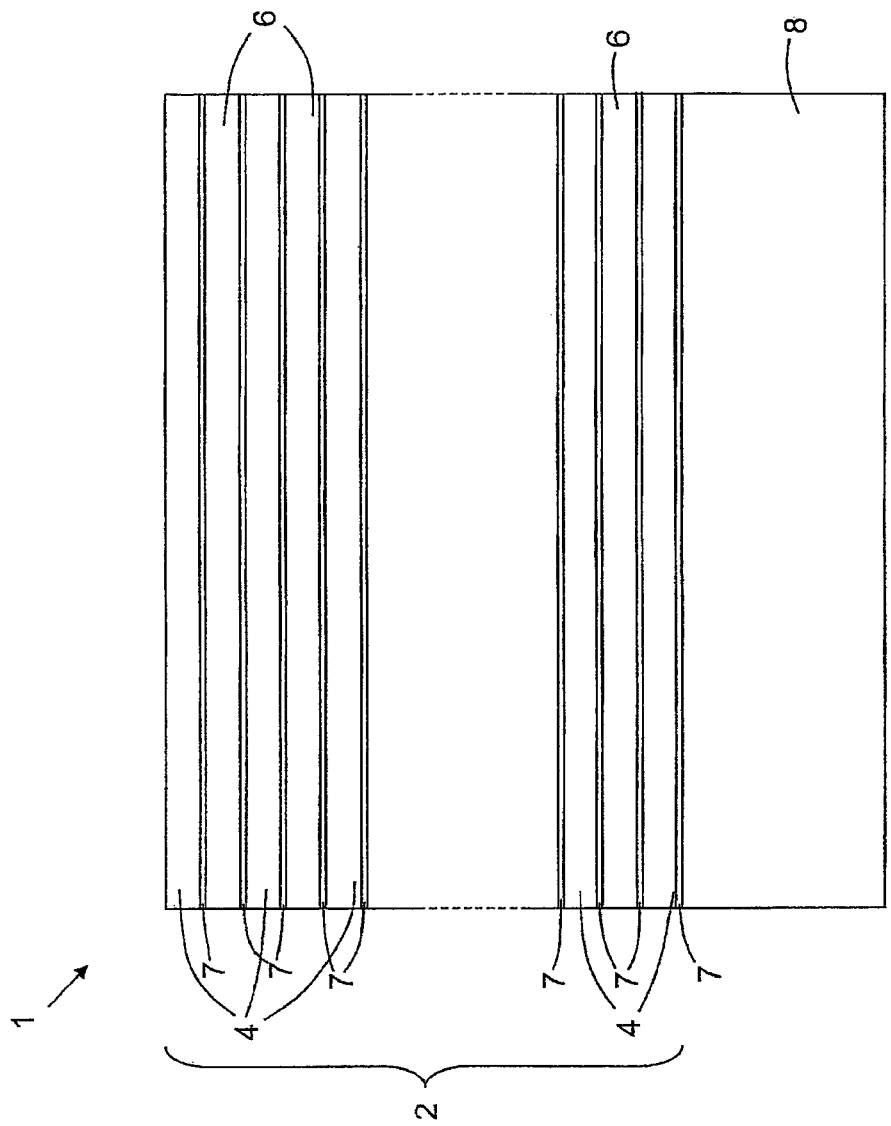
FIG. 3 schematically depicts a multilayer mirror of the lithographic apparatus of FIG. 1, according to an embodiment of the present invention.

FIG. 3 depicts an embodiment of a multilayer mirror 1. The multilayer mirror 1 is constructed and arranged to reflect radiation having a wavelength in the range of about 6.4 nm-about 7.2 nm. The multilayer mirror includes a layered structure 2 which has alternating layers 4, 6 supported by a substrate 8. In embodiments of the invention, the multilayer mirror may be located in various parts of the lithographic apparatus, such as the projection system and the illumination system, or form a part of the patterning device of that lithographic apparatus.

The alternating layers 4, 6 may be selected from the group consisting of: La and $B_4C$ layers, U and $B_4C$ layers, Th and $B_4C$ layers, La and $B_9C$ layers, U and $B_9C$ layers, Th and $B_9C$ layers, La and B layers, U and B layers, and Th and B layers.

In an embodiment, the alternating layers 4, 6 may be selected from the group consisting of: U and $B_4C$ layers, Th and $B_4C$ layers, U and $B_9C$ layers, Th and $B_9C$ layers, U and B layers, Th and B layers, U compound and $B_4C$ layers, Th compound and $B_4C$ layers, La compound and $B_9C$ layers, La compound and a $B_4C$ layers, U compound and a $B_9C$ layers, Th compound and a $B_9C$ layers, La compound and a B layers, U compound and B layers, and Th compound and a B layers. Examples of suitable U compounds are $UF_3$, $UF_4$, $UF_5$, $UCl_3$, $UCl_4$, $UCl_5$, $UI_3$, $UI_4$, $UO$, $UO_2$, $UO_3$, $U_3O_8$, $U_2O_5$, $U_3O_7$, $U_4O_9$, $UTe_2$, $UTe_3$, $UN$, $U_2N_3$, and $U_3N_2$. Examples of suitable Th compounds are $ThF_3$, $ThF_4$, $ThCl_4$, $ThI_2$, $ThI_3$, $ThI_4$, $ThH_2$, $ThO_2$, $ThSe_2$, and $ThN$. Examples of suitable La compounds are $LaH_2$, $LaH_3$, $LaF_3$, $LaCl_3$, $LaI_3$, $La_2O_3$, $LaSe$, and $LaTe$. Compounds of a material may be a nitride of that material.

A potential benefit of such alternating layers is that U layers or Th layers instead of La layers will provide a broad bandwidth, both in terms of angle as well as wavelength. The broad angle bandwidth will allow for a good amount of design freedom, making the multilayer mirror useful for optics in EUV lithography at or around 6.6 nm wavelength. Also, it may allow for a pupil of an optical system in which the multilayer mirror is included to be homogeneously filled in terms of intensity and allows for a larger numerical aperture (NA).

It can be seen in FIGS. 3, 5, 6 and 7 that between a first layer 4, for instance a La layer and a second layer 6, for instance a $B_4C$ layer, an interlayer 7 is provided configured to prevent diffusion between the first layer 4 and the second layer 6. Such an interlayer may have a thickness between about 0.2 nm and about 1 nm. Desirably, each of the first layers 4 is separated from each of the second layers 6 by such an interlayer 7.

The interlayer 7 comprises Cs in solid form. Cs in solid form, used as an interlayer, may be advantageous. One potential advantage is that Cs is one of the most transparent materials with respect to EUV radiation, with transparency comparable to that of B. If B is used as a layer in a multilayer mirror, implanting or diffusion of Cs into the B (e.g. unintentional or unavoidable implantation or diffusion) will not reduce the reflectivity of the mirror. This is in stark contrast with existing (i.e. prior art) multilayer interlayers, such as interlayers comprising Mo, Cr, Sn. Another potential advantage is that Cs does not react with La, B or $B_4C$, all of which materials are commonly used in multilayer mirrors. Since there is no reaction, the Cs interlayer will be chemically stable under EUV illumination, and this may limit or prevent any diffusion into the alternating layers. A yet further potential advantage is that Cs atoms are heavy, having a mass similar to that of La. This comparable mass should reduce a depth of implantation of energetic heavy La atoms into the Cs interlayer, maintaining the sharpness of interlayer interfaces Although it is believed that Cs should function well as an interlayer in general, for at least some of the reasons given in the preceding paragraph, it is considered that there is particular synergy with use of Cs as an interlayer in-between La, or a compound or nitride thereof, and B, $B_4C$ or $B_9C$ layers.

Cs in pure form may be desirably used as an interlayer when the first and/or second layers (e.g. the EUV absorbent layer) are also in pure form (e.g. pure La, Th and the like), since in this arrangement the Cs in pure form may provide a more robust barrier. Cs compounds like Cs iodine, Cs fluoride, Cs oxide and the like might desirably be used as an interlayer when the first and/or second layers (e.g. the EUV absorbent layer) are formed from the same type of compound (e.g. La iodine, La fluoride, La oxide and the like, or Th iodine, Th fluoride, Th oxide and the like), since in this form the Cs compound may provide a more robust barrier.

The alternating layers 4, 6 of multilayer mirrors 1 of FIGS. 3, 5, 6 and 7 can be manufactured by way of deposition techniques such as magnetron sputtering or electron beam sputtering. The Cs interlayer may be provided in solid form by the formation of one or more mono-layers of Cs, or by the deposition of a Cs hydride (e.g. in bulk form). Hydride is also substantially transparent to EUV radiation, allowing it to be used as at least part of the interlayer material.

Figure 4A:
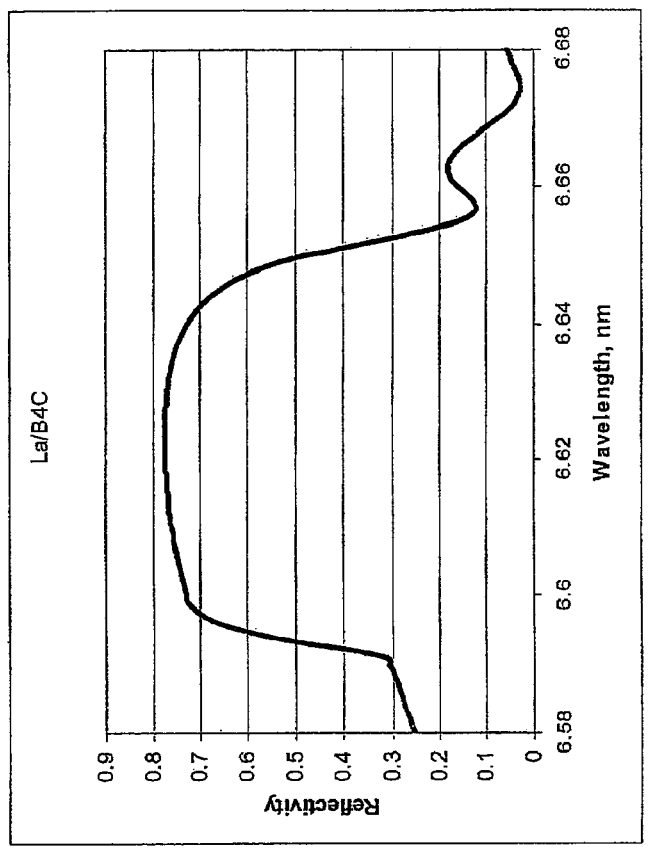
FIGS. 4a, 4b, and 4c each schematically depict a reflectance of embodiments of the multilayer mirror of FIG. 3, as a function of wavelength.
Figure 4B:
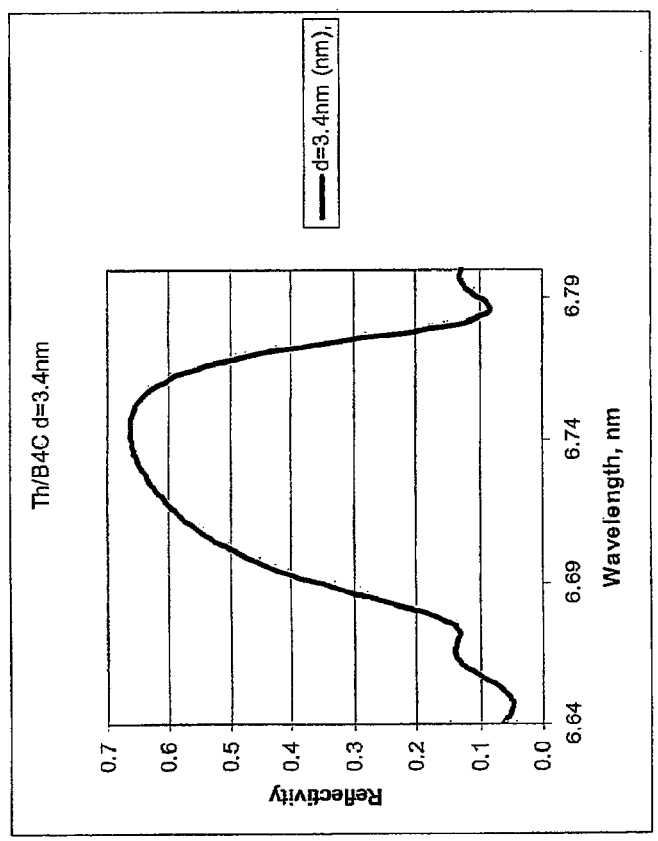
Figure 4C:
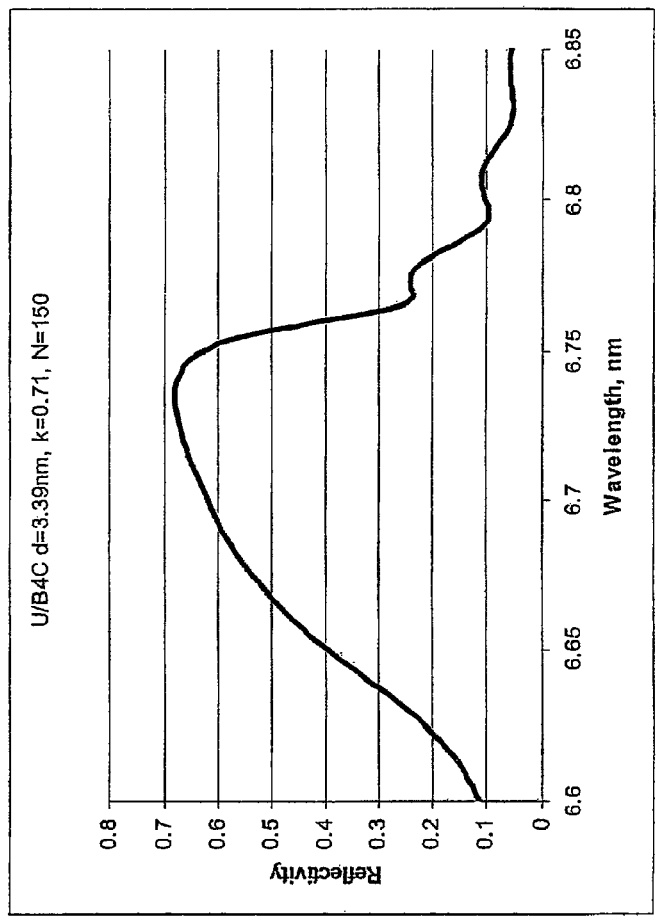

FIG. 4a is a graph showing reflectance R as a function of wavelength A for alternating layers which are La and $B_4C$ layers. The so-called full width half maximum (FWHM) of the peak shown is 0.06 nm. FIG. 4b shows reflectance as a function of wavelength A for alternating layers which are Th and $B_4C$ layers (Th/$B_4C$ layers). Here, the FWHM is 0.09 nm. FIG. 4c shows reflectance as a function of wavelength λ for alternating layers which are Th and $B_4C$ layers (U/$B_4C$ layers). Here, the FWHM is 0.15 nm.

In an embodiment, Th/$B_9C$ layers and U/$B_9C$ layers or even Th/B layers and U/B layers may be used instead of Th/$B_4C$ layers and U/$B_4C$ layers respectively. An increased B purity may allow for better reflectivity, thereby potentially reducing power losses due to absorption of radiation.

In an embodiment, the alternating layers may be C and $B_4C$ layers, C and $B_9C$ layers, or C and B layers. C is not as active as La and, therefore, in these alternating layers not as much interlayer diffusion may occur as in La/$B_4C$ layers.

A period, which may well be the sum of a thickness of the first layer 4 and a thickness of the second layer 6 and two anti-diffusion layers (interlayers) 7, may be within the range of 3-3.5 nm. The alternating layers may have a period thickness which is between about 1.7 and about 2.5 times the thickness of the first layer or the second layer.

Figure 5:
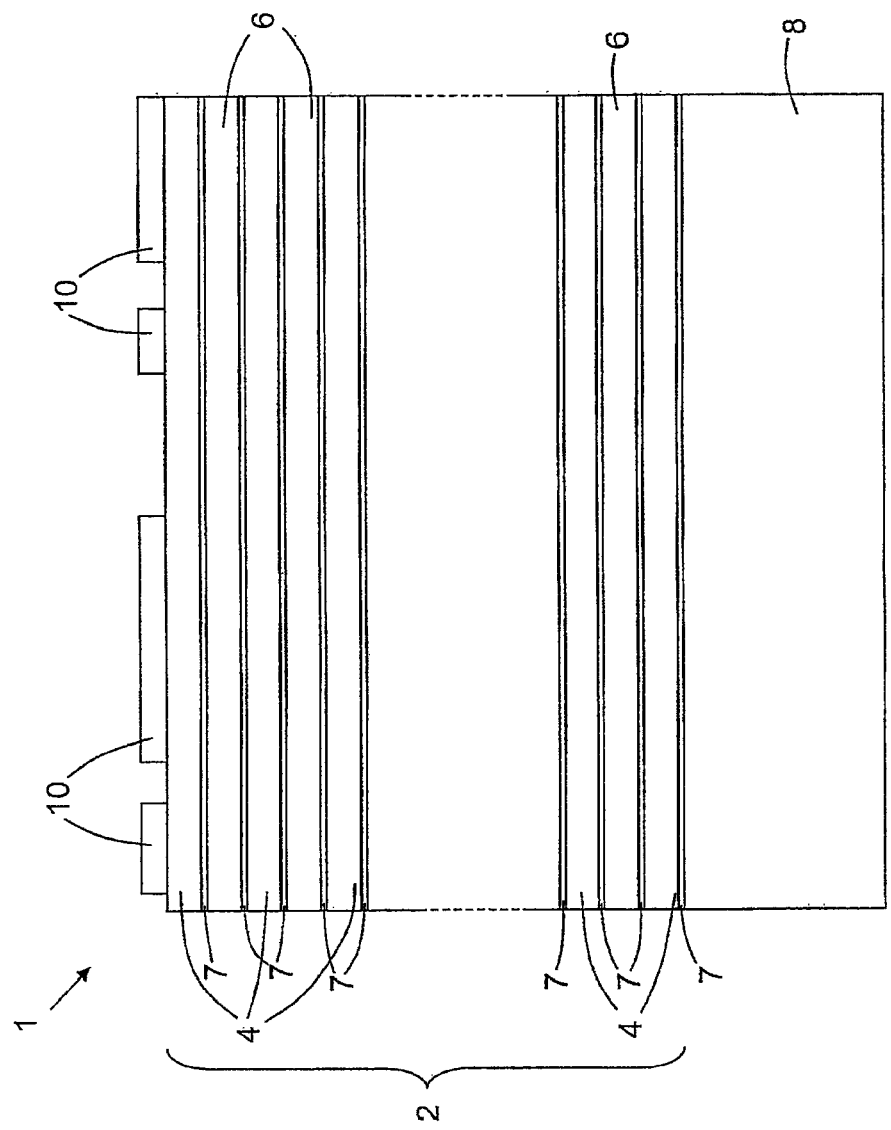
FIG. 5 depicts an embodiment of the multilayer mirror of the lithographic apparatus of FIG. 1.

An embodiment of the multilayer mirror 1 is shown in FIG. 5. This embodiment is a reflective reticle. In addition to the features of the multilayer mirror of FIG. 3, the embodiment of FIG. 5 may be provided with a structure 10 having an absorptive material which is arranged to define the pattern on its surface. Suitable materials to be employed as the absorptive material may be Cr, Ti, Si, Ru, Mo, Ta, Al, or any combination thereof.

The multilayer structure 2 of the multilayer mirror 1 may be supported by a substrate 8 in order to reduce mechanical vulnerability. Also, it is to be noted that the dotted lines in FIGS. 3 and 5 indicate an unspecified number of repeating alternating layers 4, 6. Typically, the multilayer structure 2 of the mirror 1 is formed by a number of 30 to 200 periods of alternating layers, i.e. a total number of layers between 60 and 400. Moreover, it should be noted that the Figures are schematic serving merely as illustrations and that they are not scale drawings.

Figure 6:
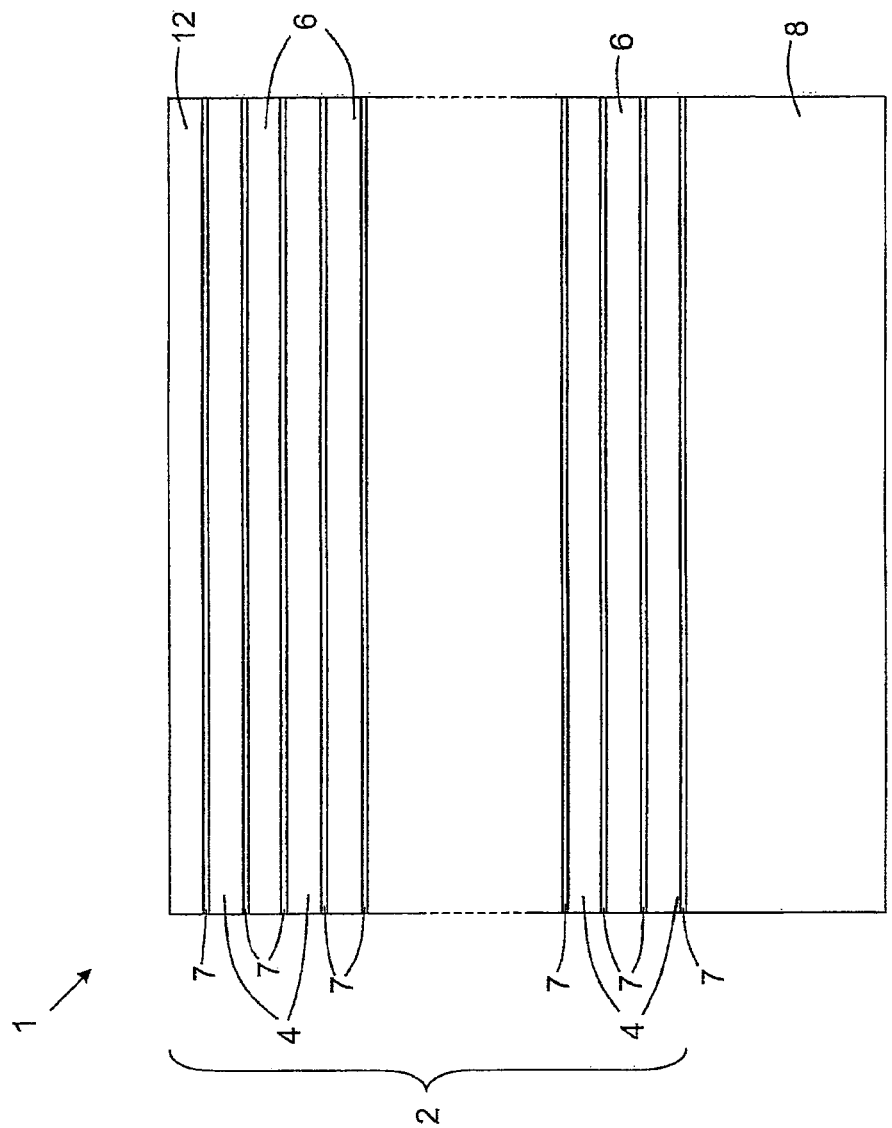
FIG. 6 depicts an embodiment of the multilayer mirror of the lithographic apparatus of FIG. 1.
Figure 7:
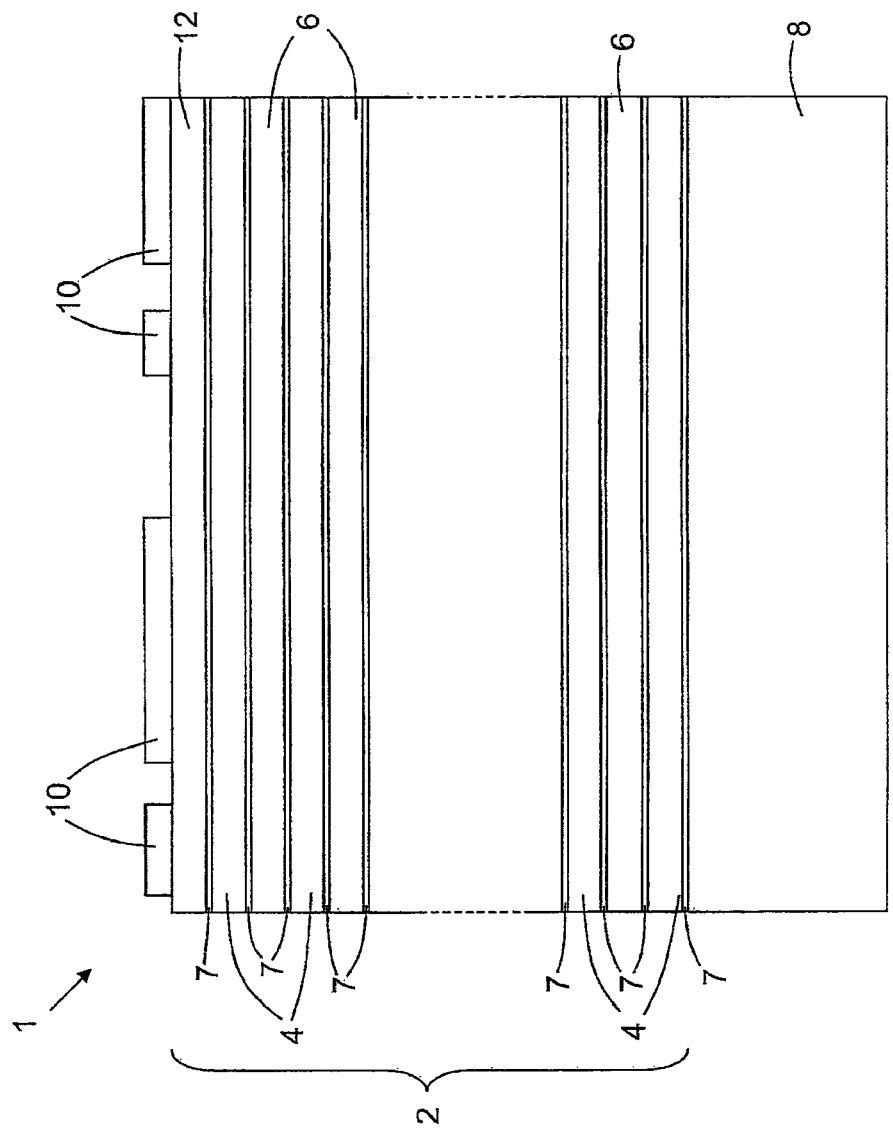
FIG. 7 depicts an embodiment of the multilayer mirror of the lithographic apparatus of FIG. 1.

Further embodiments of the multilayer mirror 1 are depicted in FIGS. 6 and 7. The embodiment of FIG. 6 is similar to the embodiment of FIG. 3. However, in the embodiment of FIG. 6, the layered structure 2 is provided with a capping layer 12. The capping layer 12 may include Ru, Ta, Ti, Rh, or any combination thereof. Such a capping layer may be suitably arranged to protect the layered structure of the multilayer mirror 1 against chemical attack. A suitable thickness for the capping layer may be anywhere within the range of 0.5 to 10 nm.

Another embodiment is depicted in FIG. 7. The embodiment of FIG. 7 is similar to the embodiment of FIG. 4. However, in the embodiment of FIG. 7, the layered structure 2 is provided with a capping layer 12. Same as mentioned while referring to FIG. 6, the capping layer 12 may include Ru, and/or Rh and may be suitably arranged to protect the layered structure of the multilayer mirror 1 against chemical attack.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc.

Although specific reference may have been made above to the use of embodiments of the invention in the context of optical lithography, it will be appreciated that the invention may be used in other applications, for example imprint lithography, and where the context allows, is not limited to optical lithography.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

While specific embodiments of the invention have been described above, it will be appreciated that the invention may be practiced otherwise than as described. For example, the multilayer mirror may be used in any application in which reflection of radiation having a wavelength in the range of about 6.4 nm to about 7.2 nm is desirable or required (e.g. in a radiation source, an alignment system, or the like).

The descriptions above are intended to be illustrative, not limiting. Thus, it will be apparent to one skilled in the art that modifications may be made to the invention as described without departing from the scope of the claims set out below.

What is claimed is:

1. A multilayer mirror constructed and arranged to reflect radiation having a wavelength in the range of about 6.4 nm to about 7.2 nm, the multilayer mirror having alternating layers, the alternating layers comprising a first layer and a second layer, the first and second layers being selected from the group consisting of:
    U, or a compound or nitride thereof, and $B_4C$ layers, respectively;
    Th, or a compound or nitride thereof, and $B_4C$ layers, respectively;
    La, or a compound or nitride thereof, and $B_9C$ layers, respectively;
    La, or a compound or nitride thereof, and $B_4C$ layers, respectively;
    U, or a compound or nitride thereof, and $B_9C$ layers, respectively;
    Th, or a compound or nitride thereof, and $B_9C$ layers, respectively;
    La, or a compound or nitride thereof, and B layers, respectively;
    U, or a compound or nitride thereof, and B layers, respectively;
    C, and B layers, respectively; and
    Th, or a compound or nitride thereof, and B layers, respectively; and
    wherein at least one of the first layers is separated from a second layer by an interlayer disposed between the at least one of the first layers and the second layer, the interlayer comprising Cs in substantially solid form.

2. The multilayer mirror according to claim 1, wherein each first layer of a plurality of first layers is separated from a second layer by an interlayer of Cs in solid form.

3. The multilayer mirror according to claim 1, wherein the solid Cs interlayer comprises one or more monolayers of Cs, or wherein the solid Cs interlayer comprises a Cs hydride.

4. The multilayer mirror according to claim 1, wherein the first and second layers are selected from the group consisting of:
La, or a compound or nitride thereof, and B layers, respectively;
La, or a compound or nitride thereof, and $B_4C$ layers, respectively; and
La, or a compound or nitride thereof, and $B_9C$ layers, respectively.

5. The multilayer mirror according to claim 1, wherein the sum of a thickness of the first layer and a thickness of the second layer is within the range of about 2.2 nm-about 3.5 nm.

6. The multilayer mirror according to claim 1, wherein the alternating layers have a period thickness which is between about 1.7 and about 2.5 times the thickness of the first layer or the second layer.

7. The multilayer mirror according to claim 1, wherein the multilayer mirror forms at least a part of a patterning device constructed and arranged to provide a beam of the radiation with a pattern in its cross-section.

8. The multilayer mirror according to claim 7, wherein the patterning device is a reticle or a mask.

9. The multilayer mirror according to claim 8, wherein the reticle or mask is provided with a structure having an absorptive material arranged to define a pattern, the absorptive material being Cr, Ta, Ti, Si, Ru, Mo, Al, or any combination thereof.

10. The multilayer mirror according to claim 1, wherein the multilayer mirror has a reflective surface provided with a capping layer comprising Ru, Rh, Ta, Ti, or any combination thereof.

11. A method of forming a multilayer mirror that is to reflect radiation having a wavelength in the range of about 6.4 nm to about 7.2 nm, the method comprising:
providing alternating layers, the alternating layers comprising a first layer and a second layer, the first and second layers being selected from the group consisting of:
U, or a compound or nitride thereof, and $B_4C$ layers, respectively;
Th, or a compound or nitride thereof, and $B_4C$ layers, respectively;
La, or a compound or nitride thereof, and $B_9C$ layers, respectively;
La, or a compound or nitride thereof, and $B_4C$ layers, respectively;
U, or a compound or nitride thereof, and $B_9C$ layers, respectively;
Th, or a compound or nitride thereof, and $B_9C$ layers, respectively;
La, or a compound or nitride thereof, and B layers, respectively;
U, or a compound or nitride thereof, and B layers, respectively;
C, and B layers, respectively; and
Th, or a compound or nitride thereof, and B layers, respectively; and
separating at least one of the first layers from a second layer by an interlayer disposed between the at least one of the first layers and the second layer, the interlayer comprising Cs in substantially solid form.

12. The method according to claim 11, wherein each first layer of a plurality of first layers is separated from a second layer by an interlayer of Cs in solid form.

13. A lithographic apparatus comprising:
an illumination system configured to condition a radiation beam;
a support structure constructed to hold a patterning device, the patterning device being capable of imparting the radiation beam with a pattern in its cross-section to form a patterned radiation beam;
a substrate table constructed to hold a substrate;
a projection system configured to project the patterned radiation beam onto a target portion of the substrate; and
a multilayer mirror constructed and arranged to reflect radiation having a wavelength in the range of about 6.4 nm to about 7.2 nm, the multilayer mirror having alternating layers, the alternating layers comprising a first layer and a second layer, the first and second layers being selected from the group consisting of:
U, or a compound or nitride thereof, and $B_4C$ layers, respectively;
Th, or a compound or nitride thereof, and $B_4C$ layers, respectively;
La, or a compound or nitride thereof, and $B_9C$ layers, respectively;
La, or a compound or nitride thereof, and $B_4C$ layers, respectively;
U, or a compound or nitride thereof, and $B_9C$ layers, respectively;
Th, or a compound or nitride thereof, and $B_9C$ layers, respectively;
La, or a compound or nitride thereof, and B layers, respectively;
U, or a compound or nitride thereof, and B layers, respectively;
C, and B layers, respectively; and
Th, or a compound or nitride thereof, and B layers, respectively; and
wherein at least one of the first layers is separated from a second layer by an interlayer disposed between the at least one of the first layers and the second layer, the interlayer comprising Cs in substantially solid form.

14. The lithographic apparatus according to claim 13, wherein the mirror forms a part of the illumination system, the patterning device, and/or the projection system.

* * * * *